United States Patent
Huang et al.

(10) Patent No.: US 9,506,965 B2
(45) Date of Patent: Nov. 29, 2016

(54) ALTERNATELY ARRANGED OVERLAY MARKS HAVING ASYMMETRIC SPACING AND MEASUREMENT THEREOF

(71) Applicant: United Microelectronics Corp., Hsinchu (TW)

(72) Inventors: Kuo-Chun Huang, Tainan (TW); Chien-Hao Chen, Tainan (TW); Wen-Liang Huang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 1016 days.

(21) Appl. No.: 13/674,704

(22) Filed: Nov. 12, 2012

(65) Prior Publication Data
US 2014/0132283 A1 May 15, 2014

(51) Int. Cl.
| | | |
|---|---|---|
| *G03F 1/42* | (2012.01) | |
| *G03F 1/38* | (2012.01) | |
| *G01R 27/26* | (2006.01) | |
| *G01R 27/02* | (2006.01) | |
| *G03F 7/20* | (2006.01) | |

(52) U.S. Cl.
CPC ........... *G01R 27/2605* (2013.01); *G01R 27/02* (2013.01); *G03F 1/42* (2013.01); *G03F 7/70633* (2013.01); *G03F 1/38* (2013.01); *G03F 7/70616* (2013.01); *G06T 2207/30148* (2013.01)

(58) Field of Classification Search
CPC . G06T 2207/30148; G03F 1/38; G03F 1/42; G03F 7/70633; G03F 7/70616; G03F 9/7088
USPC ............... 382/144–145, 151; 716/50–51
See application file for complete search history.

(56) References Cited

U.S. PATENT DOCUMENTS

| | | | | |
|---|---|---|---|---|
| 6,518,606 B1* | 2/2003 | Nanba | ............. | H01L 22/34 257/217 |
| 6,734,971 B2* | 5/2004 | Smith | ............. | G03F 7/70558 356/401 |
| 6,772,084 B2* | 8/2004 | Bischoff | ............. | G01N 21/4788 356/400 |
| 7,127,319 B2* | 10/2006 | Byers | ............. | G03F 7/70625 700/121 |
| 9,093,458 B2* | 7/2015 | Amir | ............. | H01L 23/544 |
| 2002/0102482 A1* | 8/2002 | Smith | ............. | G03F 7/70558 430/22 |
| 2005/0193362 A1* | 9/2005 | Phan | ............. | G01N 21/95607 430/22 |
| 2006/0023198 A1* | 2/2006 | Froehlich | ............. | G03F 7/70425 355/77 |
| 2007/0279607 A1* | 12/2007 | Smith | ............. | G03F 7/70558 355/52 |
| 2008/0142998 A1* | 6/2008 | Silver | ............. | H01L 23/544 257/797 |
| 2008/0248600 A1* | 10/2008 | Liu | ............. | B81C 1/00603 438/11 |
| 2010/0290019 A1* | 11/2010 | Hatada | ............. | G03F 7/70216 355/67 |
| 2012/0133938 A1* | 5/2012 | Deckers | ............. | G03F 7/70483 356/388 |
| 2013/0147066 A1* | 6/2013 | Cheng | ............. | H01L 22/12 257/797 |
| 2013/0208279 A1* | 8/2013 | Smith | ............. | G01B 11/26 356/401 |
| 2014/0065736 A1* | 3/2014 | Amir | ............. | H01L 23/544 438/14 |

* cited by examiner

Primary Examiner — Stacy Whitmore
(74) Attorney, Agent, or Firm — J.C. Patents

(57) ABSTRACT

An overlay mark including at least one first overlay mark and at least one second overlay mark is provided. The first overlay mark includes a plurality of first bars and a plurality of first spaces arranged alternately, and the first spaces are not constant. The second overlay mark includes a plurality of second bars and a plurality of second spaces arranged alternately, and the second spaces are constant. Besides, the second overlay mark partially overlaps with the first overlay mark.

19 Claims, 8 Drawing Sheets

ALTERNATELY ARRANGED OVERLAY MARKS HAVING ASYMMETRIC SPACING AND MEASUREMENT THEREOF

BACKGROUND OF THE INVENTION

Field of Invention

The present invention relates to an integrated circuit (IC) fabrication, and particularly to an overlay mark for checking the alignment accuracy between layers on a wafer, and a measurement method of the overlay mark.

Description of Related Art

As the line width of an integrated circuit process continuously gets narrower, the alignment accuracy between a lower layer and an upper layer becomes more and more important. Therefore, an overlay mark is generally formed on a wafer to check the alignment accuracy between layers.

The existing overlay measurement is an optical image based measurement. The accuracy of the measurement is usually affected by processes including chemical mechanical polishing (CMP), etching, gap fill, film topography, etc. However, it has been difficult to prove the overlay measurement results.

SUMMARY OF THE INVENTION

The present invention provides an overlay mark suitable for both optical and electrical overlay measurements.

The present invention further provides a measurement method of the overlay mark, in which an electrical overlay data is measured and transformed into an overlay data between layers.

The present invention provides an overlay mark including at least one first overlay mark. The first overlay mark includes a plurality of first bars and a plurality of first spaces arranged alternately, and the first spaces are not constant.

According to an embodiment of the present invention, an i-th first space is narrower than an (i+1)-th first space, and i is a positive integer.

According to an embodiment of the present invention, the overlay mark further includes at least one second overlay mark partially overlapping with the first overlay mark. The second overlay mark includes a plurality of second bars and a plurality of second spaces arranged alternately, and the second spaces are constant.

According to an embodiment of the present invention, the first bars respectively extend to the second spaces.

According to an embodiment of the present invention, the first bars do not contact the second bars when a misalignment does not occur.

According to an embodiment of the present invention, at least a portion of the first bars contact the adjacent second bars when a misalignment occurs.

According to an embodiment of the present invention, the overlay mark further includes a first pad electrically connected to the first overlay mark and a second pad electrically connected to the second overlay mark, so as to measure an electrical data of the first and second overlay marks.

According to an embodiment of the present invention, the at least one first overlay mark includes four first overlay marks, the at least one second overlay mark includes four second overlay marks, the first overlay marks are substantially arranged symmetrically with respect to a central point, and the second overlay marks are substantially arranged symmetrically with respect to the central point.

According to an embodiment of the present invention, the first overlay mark is an overlay mark of a first layer, while the second overlay mark is an overlay mark of a second layer adjacent to the first layer.

The present invention further provides a measurement method of an overlay mark. At least one first overlay mark is formed on a substrate. At least one second overlay mark is formed on the substrate. An electrical data of the first and second overlay marks is measured to obtain an overlay data between the first and second overlay marks.

According to an embodiment of the present invention, the first overlay mark includes a plurality of first bars and a plurality of first spaces arranged alternately, and the first spaces are not constant.

According to an embodiment of the present invention, an i-th first space is narrower than an (i+1)-th first space, and i is a positive integer.

According to an embodiment of the present invention, the second overlay mark includes a plurality of second bars and a plurality of second spaces arranged alternately, and the second spaces are constant, wherein the second overlay mark partially overlaps with the first overlay mark.

According to an embodiment of the present invention, the first bars respectively extend to the second spaces.

According to an embodiment of the present invention, the first bars do not contact the second bars when a misalignment does not occur.

According to an embodiment of the present invention, at least a portion of the first bars contact the adjacent second bars when a misalignment occurs.

According to an embodiment of the present invention, the measurement method further includes forming a first pad electrically connected to the first overlay mark and a second pad electrically connected to the second overlay mark, so as to measure the electrical data of the first and second overlay marks.

According to an embodiment of the present invention, the at least one first overlay mark includes four first overlay marks, the at least one second overlay mark includes four second overlay marks, the first overlay marks are substantially arranged symmetrically with respect to a central point, and the second overlay marks are substantially arranged symmetrically with respect to the central point.

According to an embodiment of the present invention, the first overlay mark is an overlay mark from a former patterned conductive layer, while the second overlay mark is an overlay mark from a later patterned conductive layer.

According to an embodiment of the present invention, the electrical data includes resistance, mobility or capacitance.

In view of the above, the overlay mark of the present invention can be measured by both the in-line overlay tool and the electrical tester. The electrical overlay data can be used to confirm/calibrate the in-line optical overlay data, both of which can provide the wafer mapping information when necessary. The overlay mark of the present invention is very competitive since it is multi-functional and is capable of meeting the customer requirements.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
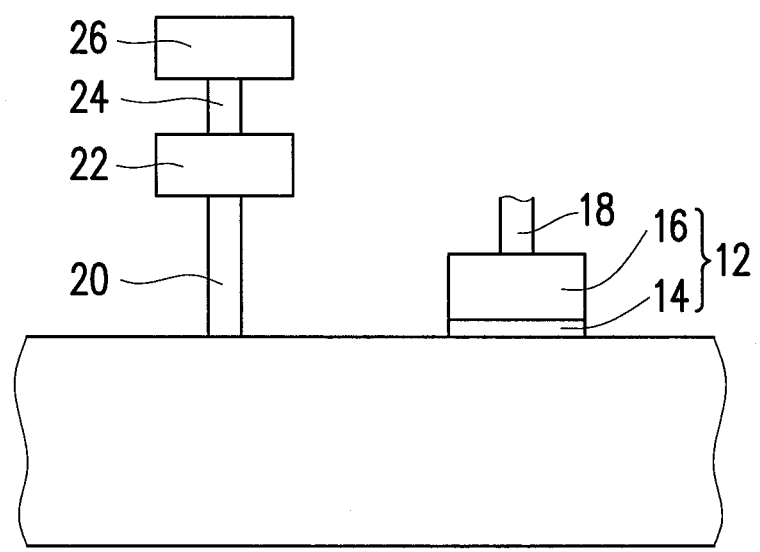
FIG. 1 is a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a semiconductor device according to an embodiment of the present invention. For the purposes of clarity and simplicity, some components such as spacers, dielectric layers, source/drain regions etc. are omitted in FIG. 1. Referring to FIG. 1, a gate structure 12 including a gate dielectric layer 14 and a polysilicon gate 16 is disposed on a substrate 10. A first contact plug 18 is disposed on the gate structure 12 and electrically connected to the polysilicon gate 16. A second contact plug 20 is disposed on the substrate 10 at one side of the gate structure 12. A first metal line 22 is formed to be electrically connected to the second contact plug 20. A via plug 24 is formed to be electrically connected to the first metal line 22. A second metal line 26 is formed to be electrically connected to the via plug 24.

For a well-manufactured integrated circuit product, it is important to align the adjacent layers to reduce the misalignment errors as the critical dimension (CD) of the semiconductor device becomes smaller and smaller. Therefore, the overlay data are measured between the adjacent layers, such as between the first contact plug 18 and the polysilicon gate 16, between the first metal line 22 and the second contact plug 20, between the via plug 24 and the first metal line 22, between and second metal line 26 and the via plug 24, etc.

Figure 2:
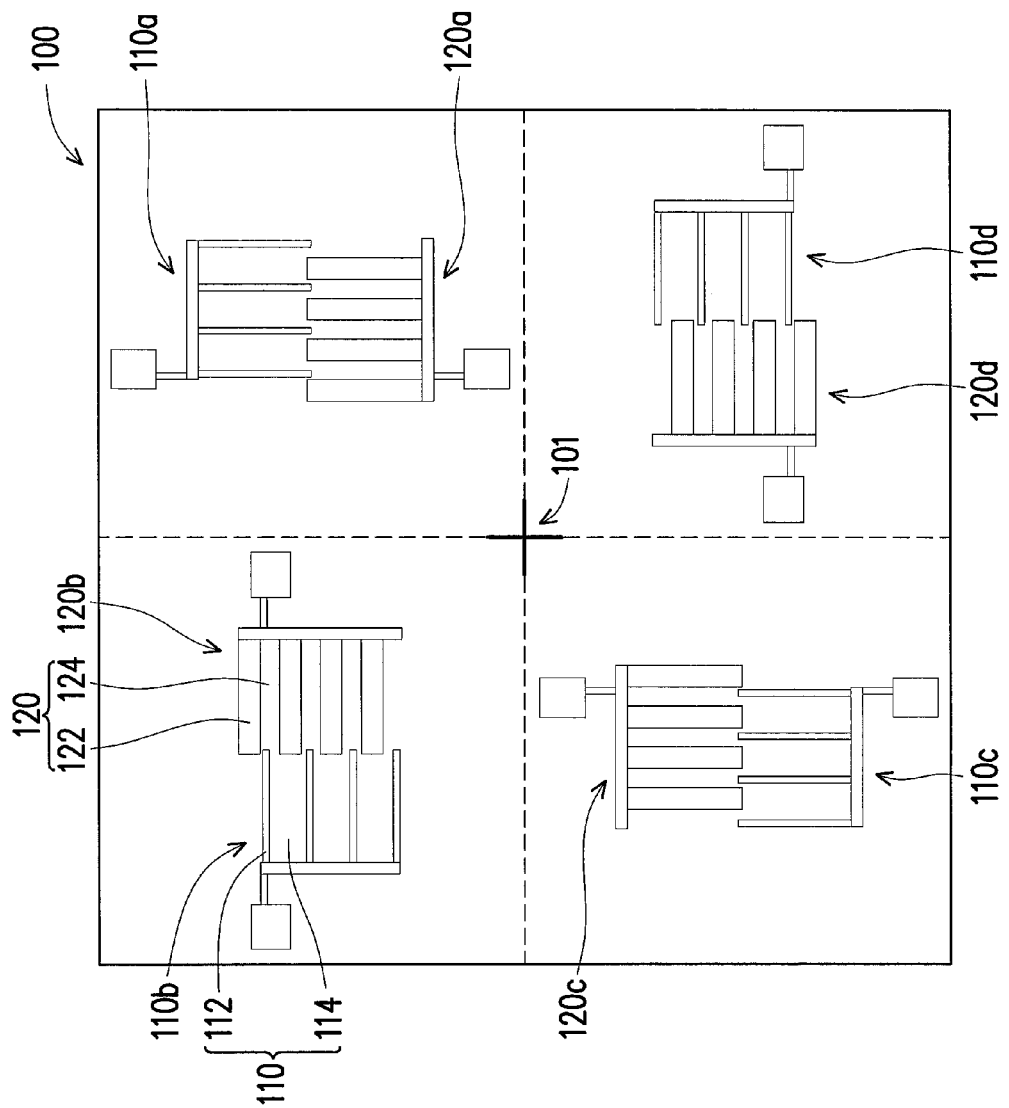
FIG. 2 illustrates a schematic top view of an overlay mark according to an embodiment of the present invention.

Accordingly, the present invention provides an overlay mark suitable for both optical and electrical overlay measurements. FIG. 2 illustrates a schematic top view of an overlay mark according to an embodiment of the present invention.

Referring to FIG. 2, the overlay mark 100 of the present invention includes at least one first overlay mark 110 and at least one second overlay mark 120. The at least one first overlay mark 110 includes a plurality of first bars 112 and a plurality of first spaces 114 arranged alternately, and the first spaces 114 are not constant. Besides, The at least one second overlay mark 120 includes a plurality of second bars 122 and a plurality of second spaces 124 arranged alternately, and the second spaces 124 are constant.

In this embodiment, the at least one first overlay mark 110 includes four first overlay marks 110a to 110d, and the at least one second overlay mark 120 includes four second overlay marks 120a to 120d, wherein the first overlay marks 110 are substantially arranged symmetrically with respect to a central point 101, and the second overlay marks 120 are substantially arranged symmetrically with respect to the central point 101. It is noted that the first overlay marks 110a-110d partially overlap with the corresponding second overlay marks 120a-120d.

The first overlay marks 110a to 110d are overlay marks of a first layer, while the second overlay marks 120a to 120d are overlay marks of a second layer adjacent to the first layer. In an embodiment, the first overlay marks 110 are overlay marks from the current photoresist layer, while the second overlay marks 120 are overlay marks from the former patterned conductive layer. In another embodiment, the first overlay marks 110 are overlay marks from the former patterned conductive layer, and the second overlay marks 120 are overlay marks from the current photoresist layer. For either case, the symmetrical arrangement of the first and second overlay marks 110 and 120 enables the overlay mark 100 of the present invention to be tested with the in-line optical tool.

Specifically, the four first overlay marks 110a to 110d are respectively disposed in the first to fourth quadrants. The first overlay mark 110a in the first quadrant and the first overlay mark 110c in the third quadrant are substantially arranged symmetrically with respect to the central point 101 and designed for measuring an X-direction bias of the first layer with respect to the central point 101. Besides, the first overlay mark 110b in the second quadrant and the first overlay mark 110d in the fourth quadrant are substantially arranged symmetrically with respect to the central point 101 and designed for measuring a Y-direction bias of the first layer with respect to the central point 101.

Similarly, the four second overlay marks 120a to 120d are respectively disposed in the first to fourth quadrants. The second overlay mark 120a in the first quadrant and the second overlay mark 120c in the third quadrant are substantially arranged symmetrically with respect to the central point 101 and designed for measuring an X-direction bias of the second layer (adjacent to the first layer) with respect to the central point 101. Besides, the second overlay mark 120b in the second quadrant and the second overlay mark 120d in the fourth quadrant are substantially arranged symmetrically with respect to the central point 101 and designed for measuring a Y-direction bias of the second layer (adjacent to the first layer) with respect to the central point 101.

The difference calculated by subtracting the X-direction bias of the second layer from the X-direction bias of the first layer is regarded as an X-direction overlay data between layers. Similarly, the difference calculated by subtracting the Y-direction bias of the second layer from the Y-direction bias of the first layer is regarded as a Y-direction overlay data between layers.

In the overlay mark of the said embodiments, one of the first and second overlay marks includes a photoresist material, the other of the first and second overlay marks includes a conductive material, and such configuration is suitable for an in-line optical overlay measurement. However, the present invention is not limited thereto.

In addition to the optical overlay measurement, the overlay mark of the present invention is suitable for an electrical overlay measurement. Herein, the electrical data such as resistance, mobility or capacitance can be obtained from the overlay mark at the same position, so as to confirm/calibrate the in-line overlay data. Specifically, in the photolithography stage, an in-line optical overlay test is performed to an overlay mark of the present invention. Thereafter, an electrical overlay test is performed to the same overlay mark in the subsequent etching stage.

In the case of the electrical overlay measurement, both of the first and second overlay marks are required to be electrically conductive. Moreover, the overlay mark 100 of the present invention further includes a first pad 130 electrically connected to the first overlay mark 110 and a second pad 140 electrically connected to the second overlay mark 120, so as to measure an electrical data of the first and second overlay marks. The electrical data includes resistance, mobility or capacitance. The details are illustrated below with reference to FIGS. 3A to 3C. For clarity of illustration, only the overlay marks used for measuring the Y-direction overlay data between layers are illustrated, and the other overlay marks used for measuring the X-direction overlay data between layers are omitted herein.

Figure 3A:
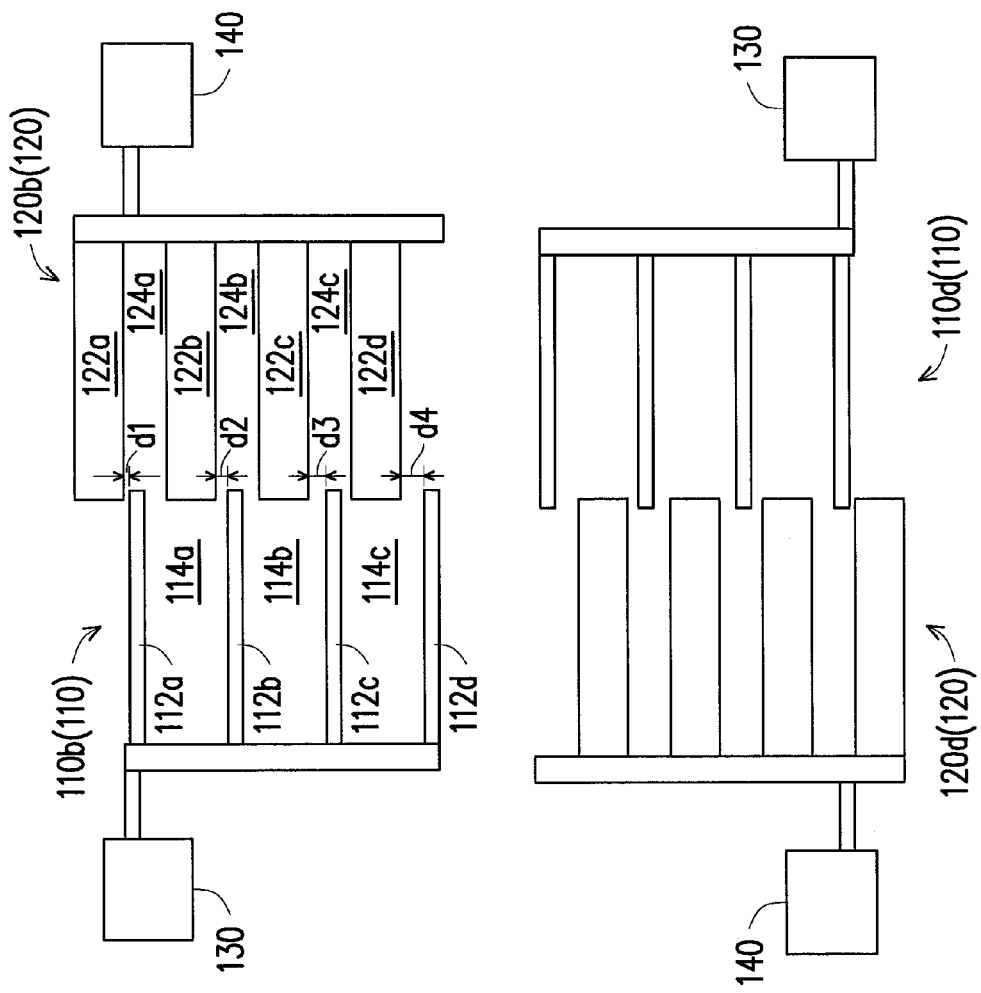
FIG. 3A illustrates a schematic top view of an overlay mark according to an embodiment of the present invention.

Referring to FIG. 3A, the first overlay mark 110b or 110d includes a plurality of first bars 112a-112d and a plurality of first spaces 114a-114c arranged alternately, and the first spaces 114a-114c are not constant. In this embodiment, four first bars 112a to 112d and three first spaces 114a to 114c are illustrated in FIG. 3A for illustration purposes, but the present invention is not limited thereto. In an embodiment, the i-th first space is narrower than an (i+1)-th first space, and i is a positive integer. Specifically, the $1^{st}$ first space 114a is narrower than the $2^{nd}$ first space 114b by a predetermined value, and the $2^{nd}$ first space 114b is narrower than the $3^{rd}$ first space 114c by the predetermined value. The predetermined value is 1 nm, for example.

Besides, the second overlay marks 120b or 120d includes a plurality of second bars 122a-122d and a plurality of second spaces 124a-124c arranged alternately, and the second spaces 124a-124c are constant. In this embodiment, four second bars 122a to 122d and three second spaces 124a to 124c are illustrated in FIG. 3A for illustration purposes, but the present invention is not limited thereto. Furthermore, the second space 124a is equal to the second space 124b or 124c.

It is noted that the first overlay marks 110b and 110d partially overlap with the corresponding second overlay marks 120b and 120d. Specifically, the first bars 112a to 112c of the first overlay mark 110b or 110d respectively extend, about ¼ to ¾ total length of the second space, to the second spaces 124a to 124c of the second overlay mark 120b or 120d. Due to the special design of the first and second overlay marks, the distance between a first bar and the corresponding second bar is gradually increased by a predetermined value from one side to the other side. The predetermined value is 1 nm, for example. Specifically, the distance d1 between the first bar 112a and the second bar 122a is 1 nm, the distance d2 between the first bar 112b and the second bar 122b is 2 nm, the distance d3 between the first bar 112c and the second bar 122c is 3 nm, and the distance d4 between the first bar 112d and the second bar 122d is 4 nm.

Figure 3B:
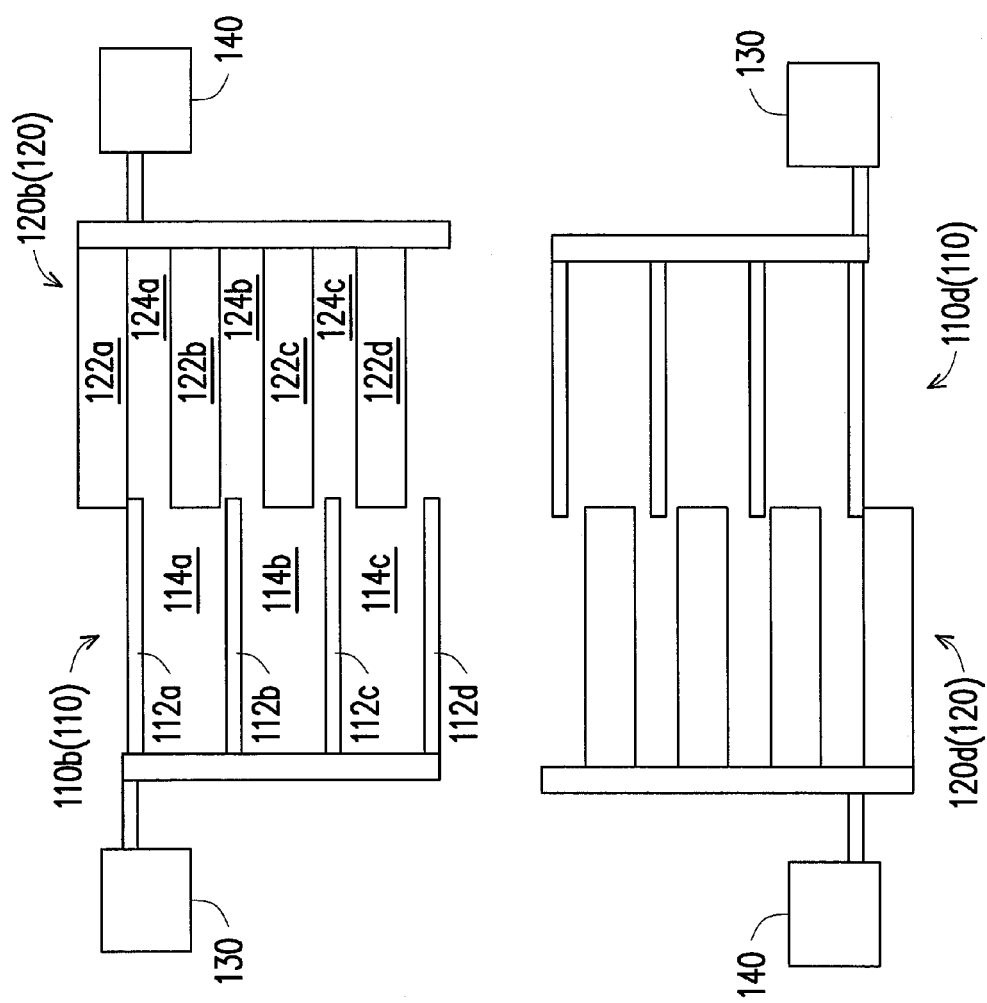
FIG. 3B illustrates a schematic top view of an overlay mark according to another embodiment of the present invention.
Figure 3C:
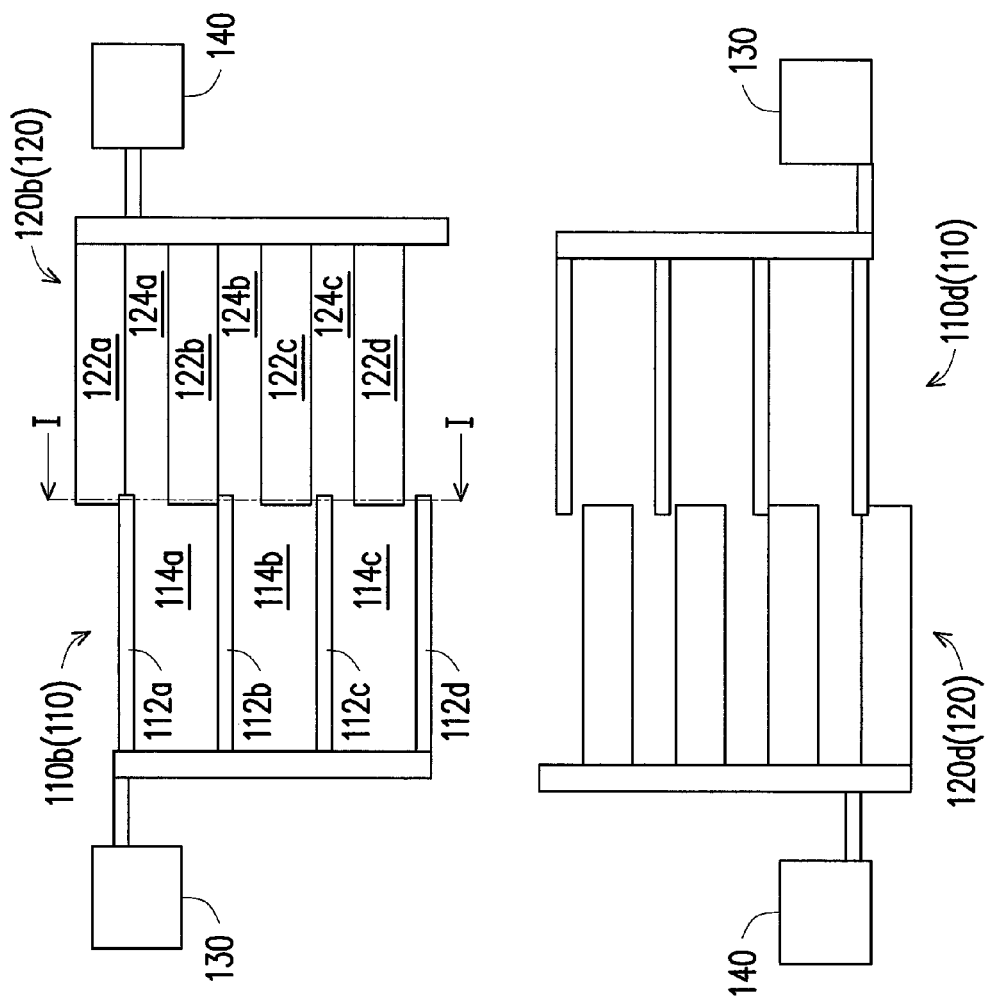
FIG. 3C illustrates a schematic top view of an overlay mark according to yet another embodiment of the present invention.

With such disposition, the first bars 112a-112d do not contact the second bars 122a-122d when a misalignment does not occur. However, when a misalignment occurs, at least a portion of the first bars contact the adjacent second bars. In an embodiment, when the adjacent layers are misaligned by 1 nm, the first bar 112a contacts the adjacent second bar 122a, as shown in FIG. 3B. In another embodiment, when the adjacent layers are misaligned by 2 nm, the first bars 112a and 112b contacts the adjacent second bars 122a and 122b, as shown in FIG. 3C. The resistance of the first and second overlay marks is decreased as the contact area between them is increased. In other words, the resistance of the first and second overlay marks is decreased as the adjacent layers are more misaligned with respect to each other.

The difference calculated by subtracting the negative Y-direction resistance of the first overlay mark 110d from the positive Y-direction resistance of the first overlay mark 110b is regarded as a Y-direction electrical overlay data between layers. The Y-direction electrical overlay data can be transformed into the optical overlay data between layers. It is noted that the electrical overlay data is not affected by the CD variation. Specifically, the CD variation is compensated by the said subtraction.

In view of the above, the measurement method of the overlay mark of the present invention includes the following steps. First, at least one first overlay mark is formed on a substrate. Thereafter, at least one second overlay mark is formed on the substrate. It is noted that the first overlay mark is an overlay mark from a former patterned conductive layer, while the second overlay mark is an overlay mark from a later patterned conductive layer. Afterwards, an electrical data (e.g. resistance, mobility or capacitance) of the first and second overlay marks is measured through the first and second pads, so as to obtain an overlay data between the first and second overlay marks.

Figure 4:
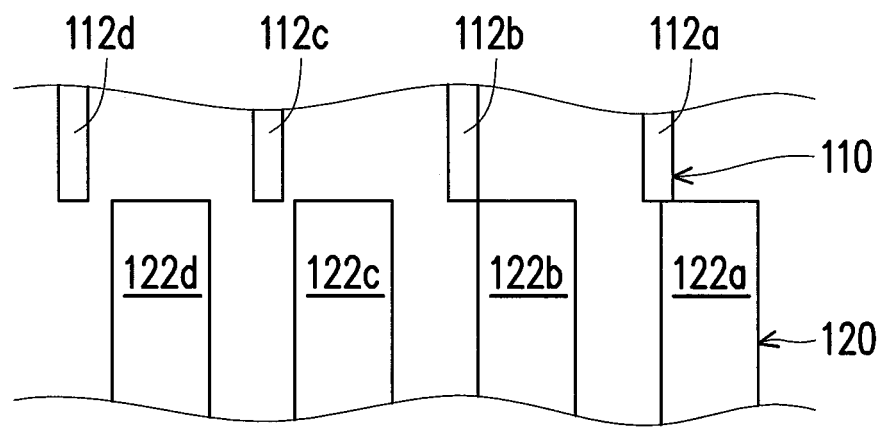
FIG. 4 illustrates a cross-sectional view taken along the line I-I of FIG. 3C.

In addition to the optical and electrical overlay measurements, the overlay mark of the present invention is suitable for a scanning electron microscope (SEM) analysis. FIG. 4 illustrates a cross-sectional view taken along the line I-I of FIG. 3C. When a cross-section SEM is implemented, the misalignment between the first overlay mark 110 and the second overlay mark 120 can be easily observed, as shown in FIG. 4.

Figure 5A:
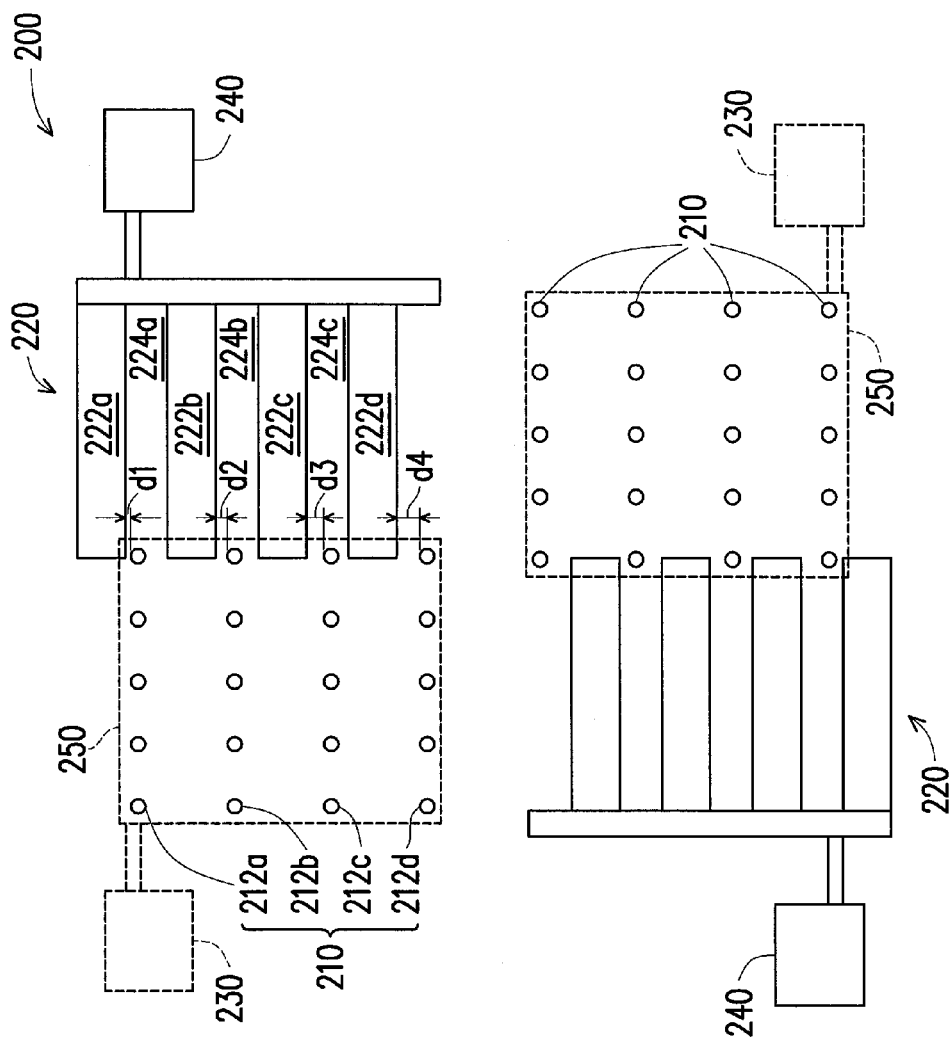
FIG. 5A illustrates a schematic top view of an overlay mark according to an embodiment of the present invention.

The above embodiments in which both of the first and second overlay marks are bar-type overlay marks are provided for illustration purposes, and are not construed as limiting the present invention. It is appreciated by persons skilled in the art that overlay marks with other shapes can be applied herein as long as the design concepts thereof fall within the scope of the present invention. FIG. 5A illustrates a schematic top view of an overlay mark according to an embodiment of the present invention.

Referring to FIG. 5A, the overlay mark 200 of the present invention includes at least one first overlay mark 210 and at least one second overlay mark 220. The first overlay mark 210 includes a plug array formed by a row of plugs 212a, a row of plugs 212b, a row of plugs 212c and a row of plugs 212d. The distance between adjacent rows of plugs is not a constant. In an embodiment, the distance between an i-th row of plugs and an (i+1)-th row of plugs is narrower than a distance between the (i+1)-th row of plugs and an (i+2)-th row of plugs, and i is a positive integer. Specifically, the distance between the $1^{st}$ row of plugs 212a and the $2^{nd}$ row of plugs 212b is narrower than the distance between the $2^{nd}$ row of plugs 212b and the $3^{rd}$ row of plugs 212c, and the distance between the $2^{nd}$ row of plugs 212b and the $3^{rd}$ row of plugs 212c is narrower than the distance between the $3^{rd}$ row of plugs 212c and the $4^{th}$ row of plugs 212d. In this embodiment, the row of plugs 212a of FIG. 5A can function as a first bar 112a of FIG. 3A, the row of plugs 212b of FIG. 5A can function as a first bar 112b of FIG. 3A, the row of plugs 212c of FIG. 5A can function as a first bar 112c of FIG. 3A, and the row of plugs 212d of FIG. 5A can function as a first bar 112d of FIG. 3A. Therefore, in terms of disposition and function, the plug array of FIG. 5A is just a specific example of the first bars of FIG. 3A. Row number is exemplified to one and could be two or more.

The second overlay mark 220 includes a plurality of bars 222a-222d and a plurality spaces 224a-214c arranged alternately, and the spaces 224a-224c are constant. Besides, the second overlay mark 220 partially overlaps with the first overlay mark 210. In an embodiment, the rows of plugs 212a-212c of the plug array respectively extend, about ¼ to ¾ total length of the space, to the spaces 224a-224c.

The overlay mark 200 of this embodiment further includes a first pad 230 electrically connected to the first overlay mark 210 and a second pad 240 electrically connected to the second overlay mark 220, so as to measure an electrical data of the first and second overlay marks 210 and 220. In this embodiment, the first overlay mark 210 is electrically to the first pad 230 through a conductive layer 250. The conductive layer 250 can be a former or later layer of the layer form which the first overlay mark 210 is formed.

Due to the special design of the first and second overlay marks, the distance between a row of plugs and the corresponding bar is gradually increased by a predetermined value from one side to the other side. The predetermined value is 1 nm, for example. Specifically, the distance d1 between the row of plugs 212a and the bar 222a is 1 nm, the distance d2 between the row of plugs 212b and the bar 222b is 2 nm, the distance d3 between the row of plugs 212c and the bar 222c is 3 nm, and the distance d4 between the row of plugs 212d and the bar 222d is 4 nm.

Figure 5B:
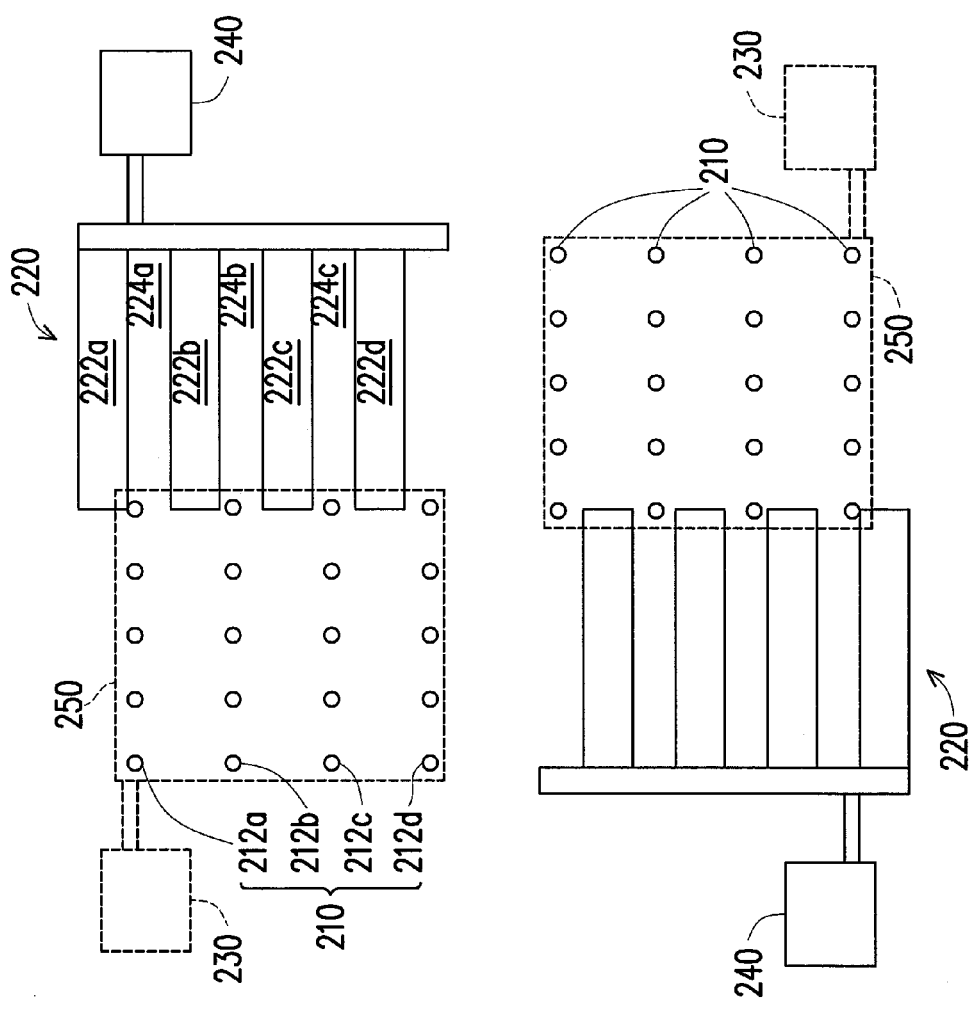
FIG. 5B illustrates a schematic top view of an overlay mark according to another embodiment of the present invention.

With such disposition, the rows of plugs 212a-212d do not contact the bars 222a-222d when a misalignment does not occur. However, when a misalignment occurs, at least a portion of the plugs contact the adjacent bars. In an embodiment, when the adjacent layers are misaligned by 1 nm, the $1^{st}$ plug 212a of the row of plugs 212a contacts the adjacent bar 222a, as shown in FIG. 5B. In another embodiment (not shown), when the adjacent layers are misaligned by 2 nm, the $1^{st}$ plug 212a of the row of plugs 212a and the $1^{st}$ plug 212b of the row of plugs 212b respectively contact the adjacent bars 222a and 222b. The resistance of the first and second overlay marks is decreased as the contact area between them is increased. In other words, the resistance of the first and second overlay marks is decreased as the adjacent layers are more misaligned with respect to each other.

In summary, the overlay mark of the present invention can be measured by both the in-line overlay tool and the electrical tester. Besides, the SEM analysis can be implemented to the same overlay mark. The electrical overlay data can be used to confirm/calibrate the in-line overlay data, both of which can provide the wafer mapping information when necessary. The overlay mark of the present invention is very competitive since it is multi-functional and is capable of meeting the customer requirements.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An overlay mark comprising:
   at least one first overlay mark, wherein the first overlay mark comprises a plurality of first bars and a plurality of first spaces arranged alternately, and the first spaces are not constant; and
   at least one second overlay mark partially overlapping with the first overlay mark, wherein the second overlay mark comprises a plurality of second bars and a plurality of second spaces arranged alternately, and the second spaces are constant.

2. The overlay mark of claim 1, wherein an i-th first space is narrower than an (i+1)-th first space, and i is a positive integer.

3. The overlay mark of claim 1, wherein the first bars respectively extend to the second spaces.

4. The overlay mark of claim 3, wherein the first bars do not contact the second bars when a misalignment does not occur.

5. The overlay mark of claim 3, wherein at least a portion of the first bars contact the adjacent second bars when a misalignment occurs.

6. The overlay mark of claim 5, further comprising a first pad electrically connected to the first overlay mark and a second pad electrically connected to the second overlay mark, so as to measure an electrical data of the first and second overlay marks.

7. The overlay mark of claim 1, wherein the at least one first overlay mark comprises four first overlay marks, the at least one second overlay mark comprises four second overlay marks, the first overlay marks are substantially arranged symmetrically with respect to a central point, and the second overlay marks are substantially arranged symmetrically with respect to the central point.

8. The overlay mark of claim 1, wherein the first overlay mark is an overlay mark of a first layer, while the second overlay mark is an overlay mark of a second layer adjacent to the first layer.

9. A measurement method of an overlay mark, comprising:
   forming at least one first overlay mark on a substrate;
   forming at least one second overlay mark on the substrate; and
   measuring an optical data and an electrical data of the same first and second overlay marks to obtain an overlay data between the first and second overlay marks,
   wherein each of the first and second overlay marks is used to measure each of the optical data and the electrical data.

10. The measurement method of claim 9, wherein the first overlay mark comprises a plurality of first bars and a plurality of first spaces arranged alternately, and the first spaces are not constant.

11. The measurement method of claim 10, wherein an i-th first space is narrower than an (i+1)-th first space, and i is a positive integer.

12. The measurement method of claim 10, wherein the second overlay mark comprises a plurality of second bars and a plurality of second spaces arranged alternately, and the second spaces are constant, and wherein the second overlay mark partially overlaps with the first overlay mark.

13. The measurement method of claim 12, wherein the first bars respectively extend to the second spaces.

14. The measurement method of claim 13, wherein the first bars do not contact the second bars when a misalignment does not occur.

15. The measurement method of claim 13, wherein at least a portion of the first bars contact the adjacent second bars when a misalignment occurs.

16. The measurement method of claim 15, further comprising forming a first pad electrically connected to the first overlay mark and a second pad electrically connected to the second overlay mark, so as to measure the electrical data of the first and second overlay marks.

17. The measurement method of claim 12, wherein the at least one first overlay mark comprises four first overlay marks, the at least one second overlay mark comprises four second overlay marks, the first overlay marks are substantially arranged symmetrically with respect to a central point, and the second overlay marks are substantially arranged symmetrically with respect to the central point.

18. The measurement method of claim 9, wherein the first overlay mark is an overlay mark from a former patterned conductive layer, while the second overlay mark is an overlay mark from a later patterned conductive layer.

19. The measurement method of claim 9, wherein the electrical data comprises resistance, mobility or capacitance.

* * * * *